United States Patent
Kawabata et al.

(10) Patent No.: US 11,933,543 B2
(45) Date of Patent: Mar. 19, 2024

(54) HEAT SINK

(71) Applicant: FURUKAWA ELECTRIC CO., LTD., Tokyo (JP)

(72) Inventors: Kenya Kawabata, Tokyo (JP); Masahiro Meguro, Tokyo (JP); Ryo Tsubata, Tokyo (JP); Hirofumi Aoki, Tokyo (JP); Yoshikatsu Inagaki, Tokyo (JP); Hiroshi Sakai, Tokyo (JP); Hideaki Kawabata, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 18/048,739

(22) Filed: Oct. 21, 2022

(65) Prior Publication Data

US 2023/0106794 A1 Apr. 6, 2023

Related U.S. Application Data

(63) Continuation of application No. PCT/JP2022/008570, filed on Mar. 1, 2022.

(30) Foreign Application Priority Data

Mar. 9, 2021 (JP) ................. 2021-037415

(51) Int. Cl.
 *F28D 15/02* (2006.01)
(52) U.S. Cl.
 CPC .................... *F28D 15/02* (2013.01)
(58) Field of Classification Search
 CPC ...... F28D 15/02; F28D 15/04; F28F 2215/00; F28F 2215/02; F28F 2215/04
 See application file for complete search history.

(56) References Cited

U.S. PATENT DOCUMENTS 5,924,482 A * 7/1999 Edwards ............... H01L 23/427
165/104.31
6,082,443 A 7/2000 Yamamoto et al.
(Continued)

FOREIGN PATENT DOCUMENTS

JP H10267571 A 10/1998
JP 2004119621 A 4/2004
(Continued)

OTHER PUBLICATIONS

[English Translation] Dicision to Grant a Patent dated Jan. 17, 2022 for Japanese Patent Application No. 2021-037415, pp. all.
(Continued)

*Primary Examiner* — Travis Ruby
(74) *Attorney, Agent, or Firm* — Dorsey & Whitney LLP

(57) ABSTRACT

A heat sink includes: a container having a cavity inside and a first surface and a second surface opposite the first surface; a working fluid encapsulated in the cavity; and a steam flow path in the cavity where the working fluid in a gas phase flows, the first surface having a flat part and a protruding part projecting from the flat part in an external direction, causing the container to have a flat portion and a protruding portion projecting from the flat portion in the external direction, an inner space of the protruding portion of the container being in communication with an inner space of the flat portion, causing the cavity to be formed, and a first heat radiating fin being provided on an exterior of the flat part of the first surface and a second heat radiating fin being provided on an exterior of the second surface.

10 Claims, 4 Drawing Sheets

(56) References Cited

U.S. PATENT DOCUMENTS

| | | | | |
|---|---|---|---|---|
| 6,148,905 | A * | 11/2000 | Sehmbey | F28D 15/02 174/15.2 |
| 6,169,660 | B1 * | 1/2001 | Sarraf | H01L 23/467 174/16.3 |
| 6,269,866 | B1 | 8/2001 | Yamamoto et al. | |
| 6,339,269 | B1 * | 1/2002 | Hsiao | H02K 9/00 310/60 A |
| 6,725,909 | B1 * | 4/2004 | Luo | H01L 23/427 174/15.2 |
| 7,069,978 | B2 * | 7/2006 | Rosenfeld | H01L 23/427 138/140 |
| 7,128,134 | B2 * | 10/2006 | Shih | F28D 15/046 165/104.33 |
| 7,357,173 | B2 * | 4/2008 | Griesmayer | H01L 23/3677 257/E23.105 |
| 8,550,150 | B2 * | 10/2013 | Hou | F28D 15/0266 165/104.21 |
| 9,995,537 | B2 * | 6/2018 | Aoki | F28F 3/02 |
| 10,098,259 | B2 * | 10/2018 | McLaughlin | F28F 3/046 |
| 11,112,186 | B2 * | 9/2021 | Watanabe | F28D 15/0266 |
| 11,421,942 | B2 * | 8/2022 | Kume | F28D 15/0233 |
| 2002/0007555 | A1 * | 1/2002 | Ikeda | F28D 15/06 29/890.032 |
| 2002/0144804 | A1 * | 10/2002 | Liang | F28D 15/0233 165/185 |
| 2004/0069462 | A1 | 4/2004 | Hashimoto | |
| 2010/0051239 | A1 * | 3/2010 | Lin | F28D 15/0233 29/890.032 |
| 2010/0326629 | A1 * | 12/2010 | Meyer, IV | F28D 15/0233 165/104.33 |
| 2012/0002370 | A1 | 1/2012 | Ohsawa et al. | |
| 2013/0294030 | A1 * | 11/2013 | Wang | G06F 1/203 165/104.21 |
| 2015/0285562 | A1 * | 10/2015 | Huang | F28D 15/02 29/890.032 |
| 2017/0082378 | A1 * | 3/2017 | Wang | H01L 23/427 |
| 2017/0343296 | A1 * | 11/2017 | Lan | F28D 15/04 |
| 2018/0017335 | A1 * | 1/2018 | Lin | H01L 23/473 |
| 2018/0063994 | A1 * | 3/2018 | Wu | H05K 7/20409 |
| 2018/0128552 | A1 * | 5/2018 | Ito | F28D 15/02 |
| 2018/0192545 | A1 * | 7/2018 | Chen | H05K 7/20409 |
| 2018/0209635 | A1 * | 7/2018 | Luiten | F21V 29/713 |
| 2020/0173731 | A1 | 6/2020 | Kawabata et al. | |
| 2020/0400379 | A1 | 12/2020 | Watanabe et al. | |

FOREIGN PATENT DOCUMENTS

| | | |
|---|---|---|
| JP | 2010212623 A | 9/2010 |
| JP | 2020085426 A | 6/2020 |
| JP | 2020176773 A | 10/2020 |
| JP | 7029009 B1 | 2/2022 |

OTHER PUBLICATIONS

[English Translation] Notice of Reasons for Refusal dated Aug. 16, 2021 for Japanese Patent Application No. 2021-037415, pp. all.
International Search Report and Written Opinion (English Translation for ISR only) dated May 17, 2022, for International Patent Application No. PCT/JP2022/008570, pp. all.

* cited by examiner

HEAT SINK

CROSS REFERENCE TO RELATED APPLICATIONS

The present application is a continuation application of International Patent Application No. PCT/JP2022/008570 filed on Mar. 1, 2022, which claims the benefit of Japanese Patent Application No. 2021-037415, filed on Mar. 9, 2021. The contents of these applications are incorporated herein by reference in their entirety.

BACKGROUND

Technical Field

The present disclosure relates to a heat sink that has an excellent heat radiating fin efficiency and, consequently, exhibits an excellent cooling performance.

Background

Electronic components such as semiconductor devices mounted in electric/electronic apparatuses suffer an increase in amount of heat generation due to, for example, high-density mounting necessitated by an improvement in functionality, which makes it more important to cool the electronic components these days. For a method of cooling a heating element in an electronic component or the like, a heat sink including a vapor chamber equipped with a heat radiating fin is used in some cases.

The vapor chamber is a heat transport member including a flattened container having a cavity formed inside, a working fluid encapsulated in the cavity of the flattened container, and a steam flow path defined in the cavity and through which the working fluid in a gas phase flows. The cavity of the vapor chamber is a pressure-reduced sealed space. By virtue of a heat transport function of the vapor chamber, heat from the heating element, which is thermally connected to the vapor chamber, is transported to the whole of the vapor chamber and the heat transported to the whole of the vapor chamber is transferred to the heat radiating fin, which is thermally connected to an exterior of the vapor chamber, and radiated from the heat radiating fin to an external environment, whereby the heating element is cooled.

The amount of heat generation of a heating element such as a semiconductor device, which is to be cooled by a heat sink, has been increasing. Accordingly, in order to efficiently cool a heating element having a large amount of heat generation, for example, a cooling apparatus has been proposed, the cooling apparatus including a heat diffuser that diffuses heat drawn from the heating element and a heat transporter stacked on the heat diffuser in a thickness direction of the heat diffuser and that transports the heat diffused by the heat diffuser, the heat diffuser including an upper plate, a lower plate opposite the upper plate, and an inner space formed by stacking the upper plate and the lower plate and in which a coolant can be encapsulated, the heat transporter including an upper plate, a lower plate opposite the upper plate, and an inner space formed by stacking the upper plate and the lower plate and in which a coolant can be encapsulated (Japanese Patent Laid-Open No. 2010-212623). According to Japanese Patent Laid-Open No. 2010-212623, a stacked structure including a vapor chamber having a heat diffusion function and a vapor chamber having a heat transport function provides an apparatus that efficiently cools a heating element having a large amount of heat generation.

However, according to Japanese Patent Laid-Open No. 2010-212623, the vapor chamber having the heat transport function is thermally connected to the vapor chamber having the heat diffusion function and such a structure causes a thermal resistance to occur between the vapor chamber having the heat diffusion function and the vapor chamber having the heat transport function, which requires an improvement to efficiently cool a heating element having a large amount of heat generation.

In addition, in order to cool a heating element having a large amount of heat generation, it has been proposed that a fin area of a heat radiating fin thermally connected to an exterior of a vapor chamber is increased to improve a heat radiation performance of the heat radiating fin. However, an increase in the fin area of the heat radiating fin causes the heat radiating fin to have a region contributable to heat radiation and a region not sufficiently contributable to heat radiation, which causes a heat radiation efficiency of the heat radiating fin to decrease in some cases. In other words, an increase in volume of the heat sink as a whole resulting from an increase in fin area of the heat radiating fin cannot sufficiently improve a heat radiation performance as the heat sink.

SUMMARY

The present disclosure is related to providing a heat sink able to exhibit an excellent heat radiation performance by preventing a decrease in heat radiation efficiency of a heat radiating fin and increasing a fin area of the heat radiating fin.

The gist of the present disclosure is as follows.

[1] A heat sink including:
a container having a cavity formed inside and that has a first surface and a second surface opposite the first surface; a working fluid encapsulated in the cavity; and a steam flow path defined in the cavity and through which the working fluid in a gas phase flows, in which
the first surface has a flat part and a protruding part projecting from the flat part in an external direction, causing the container to have a flat portion and a protruding portion projecting from the flat portion in the external direction,
an inner space of the protruding portion of the container is in communication with an inner space of the flat portion, causing the cavity to be formed,
a first heat radiating fin is provided on an exterior of the flat part of the first surface and a second heat radiating fin is provided on an exterior of the second surface, and
the protruding portion is provided at a middle portion, one end, and/or another end in a width direction of the container.

[2] A heat sink including:
a container having a cavity formed inside and that has a first surface and a second surface opposite the first surface; a working fluid encapsulated in the cavity; and a steam flow path defined in the cavity and through which the working fluid in a gas phase flows, in which
the first surface has a flat part and a protruding part projecting from the flat part in an external direction and the second surface has a flat part and a protruding part projecting from the flat part in the external direction, causing the container to have a flat portion and a protruding portion projecting from the flat portion in the external direction, an inner space of the protruding portion of the container is in communication with an inner space of the flat portion, causing the cavity to be formed, and a first heat radiating fin is provided on an exterior of the flat part of the first surface and a second heat radiating fin is provided on an exterior of the flat part of the second surface.

[3] The heat sink according to [1], in which the container includes one plate-shaped body and another plate-shaped body opposite the one plate-shaped body, the one plate-shaped body having the protruding portion projecting in the external direction.

[4] The heat sink according to [2], in which the container includes one plate-shaped body and another plate-shaped body opposite the one plate-shaped body, the one plate-shaped body and the other plate-shaped body each having the protruding portion projecting in the external direction.

[5] The heat sink according to any one of [1] to [4], in which the protruding portion includes a heat receiver to which a heating element, which is an object to be cooled, is thermally connected and no heat radiating fin is provided at a distal end of the protruding portion.

[6] The heat sink according to any one of [1] to [5], in which the protruding portion has a stepped portion and a third heat radiating fin is additionally provided on an exterior of the stepped portion.

[7] The heat sink according to any one of [1] to [6], in which a side surface of the protruding portion has a slanted portion further narrowed as progress toward a distal end of the protruding portion and a fourth heat radiating fin is additionally provided on an exterior of the slanted portion.

[8] The heat sink according to any one of [1] to [7], in which the protruding portion includes a single protruding portion.

[9] The heat sink according to any one of [1] to [7], in which a plurality of protruding portions including the protruding portion are provided.

[10] The heat sink according to any one of [1] to [9], in which the flat portion of the container is provided with a step.

[11] The heat sink according to any one of [1] to [10], in which a wick structure is provided in the cavity across the container.

According to the aspect of the heat sink, the first surface of the container has a flat part and a protruding part projecting from the flat part in an external direction, causing the container to have a flat portion and a protruding portion projecting from the flat portion in the external direction, and a first heat radiating fin is provided on an exterior of the flat part of the first surface and a second heat radiating fin is provided on the second surface, which makes it possible to prevent a decrease in heat radiation efficiency of the heat radiating fins and increase a fin area of the heat radiating fins and thus makes it possible to exhibit an excellent heat radiation performance. In other words, according to the aspect of the heat sink, the heat radiating fins are thermally connected to the container as being divided into the first heat radiating fin and the second heat radiating fin, which makes it possible to prevent creation of a region not sufficiently contributable to heat radiation to prevent a decrease in heat radiation efficiency of the heat radiating fins even though the fin area of the heat radiating fins is increased.

In addition, according to the aspect of the heat sink, an inner space of the protruding portion of the container is in communication with an inner space of the flat portion to cause the cavity of the container to be formed, which makes it possible to prevent a thermal resistance between the flat portion and the protruding portion of the container and to efficiently cool a heating element having a large amount of heat generation.

According to the aspect of the heat sink, it is also possible that the first surface has a flat part and a protruding part projecting from the flat part in an external direction and a second surface has a flat part and a protruding part projecting from the flat part in the external direction in accordance with an environment where the heat sink is to be installed, the location of a heating element, etc., causing the container to have a flat portion and a protruding portion projecting from the flat portion in the external direction, and a first heat radiating fin is provided on an exterior of the flat part of the first surface and a second heat radiating fin is provided on an exterior of the flat part of the second surface. Such an aspect is excellent in flexibility in design in accordance with the location of the heating element, etc.

In other words, according to the aspect of the heat sink, the heat radiating fins are thermally connected to the container as being divided into the first heat radiating fin and the second heat radiating fin with flexibility in design in accordance with the location of the heating element, etc., which makes it possible to prevent creation of a region not sufficiently contributable to heat radiation to prevent a decrease in heat radiation efficiency of the heat radiating fins even though the fin area of the heat radiating fins is increased.

According to the aspect of the heat sink, the protruding portion has a stepped portion and a third heat radiating fin is additionally provided on an exterior of the stepped portion, which makes it possible to further increase the number of the heat radiating fins connected to the container while the protruding portion is provided. The heat radiation performance is thus further improved.

According to the aspect of the heat sink, a side surface of the protruding portion has a slanted portion further narrowed as progress toward a distal end of t protruding portion and a fourth heat radiating fin is additionally provided on an exterior of the slanted portion, which makes it possible to further increase the number of the heat radiating fins connected to the container while the protruding portion is provided. The heat radiation performance is thus further improved.

DETAILED DESCRIPTION

Figure 1:
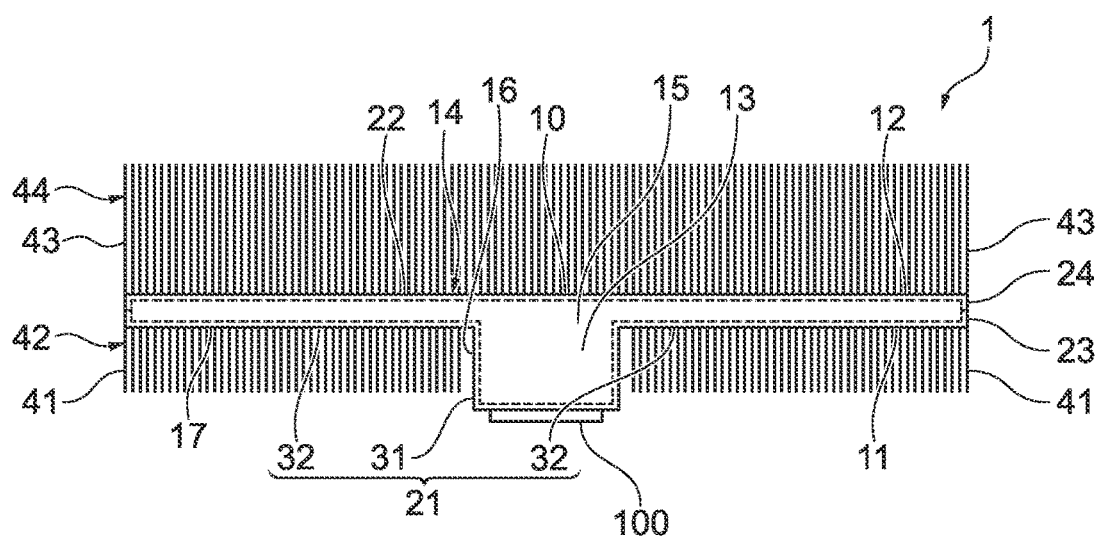
FIG. 1 is a side view of assistance in explaining the summary of a heat sink according to a first embodiment of the present disclosure.

Hereinafter, a detailed description will be made on a heat sink according to a first embodiment of the present disclosure. FIG. 1 is a side view of assistance in explaining the summary of the heat sink according to the first embodiment of the present disclosure.

As illustrated in FIG. 1, a heat sink 1 according to the first embodiment of the present disclosure includes a container 10 having a cavity 13 formed inside by stacking opposite two plate-shaped bodies, that is, one plate-shaped body 11 and another plate-shaped body 12 opposite the one plate-shaped body 11, a working fluid (not illustrated) encapsulated in the cavity 13, and a steam flow path 15 defined in the cavity 13 and through which the working fluid in a gas phase flows. A vapor chamber 14 is formed by the container 10 having the cavity 13 formed inside, the working fluid, and the steam flow path 15.

The container 10 is a container in the form of a thin plate, where the one plate-shaped body 11 has a first principal surface, or first surface 21, and the other plate-shaped body 12 has a second principal surface, or second surface 22. Thus, the container 10 has the first principal surface, or first surface 21, and the second principal surface, or second surface 22, opposite the first surface 21.

The first surface 21 has a flattened flat part 32 and a protruding part 31 projecting from the flat part 32 in an external direction. In the heat sink 1, the single protruding part 31 is provided at a middle portion of the first surface 21. In addition, a side surface of the protruding part 31 projects from the flat part 32 in a vertical direction. In contrast, the second surface 22 has no protruding part and the second surface 22 is in the form of a flattened flat part as a whole. With the first surface 21 having the flat part 32 and the protruding part 31 projecting from the flat part 32 in the external direction, the container 10 has a flat portion 17 and a protruding portion 16 projecting from the flat portion 17 in the external direction. Thus, in the container 10, the single protruding portion 16 is formed at the middle portion of the first surface 21, while no protruding portion is provided in the second surface 22. Therefore, the flat portion 17 and the protruding portion 16 of the container 10 are integrally molded. In addition, a side surface of the protruding portion 16 projects from the flat portion 17 in the vertical direction.

In addition, a side wall 23 is erected on the one plate-shaped body 11 along a periphery of the first surface 21 and a side wall 24 is erected on the other plate-shaped body 12 along a periphery of the second surface 22. A distal edge of the side wall 23 of the one plate-shaped body 11 and a distal edge of the side wall 24 of the other plate-shaped body 12 are opposed and brought into contact with each other, whereby the inner space, or cavity 13, of the container 10 is formed. Thus, the side wall 23 and the side wall 24 form a side surface of the container 10. The cavity 13, which is a sealed space, is pressure-reduced by a deaeration treatment. An inner space of the protruding portion 16 of the container 10 is in communication with an inner space of the flat portion 17 and the cavity 13 of the container 10 is formed by the inner space of the protruding portion 16 and the inner space of the flat portion 17. Thus, the working fluid can flow between the inner space of the protruding portion 16 and the inner space of the flat portion 17.

In the heat sink 1, examples of the shape of the container 10 include, without limitation, a polygonal shape such as a quadrangular shape, a circular shape, an oval shape, and a shape having a linear portion and a curved portion in a plan view (in a state as seen from a vertical direction relative to the flat portion 17 of the container 10).

In the heat sink 1, a first heat radiating fin 41 is erected on, within the first surface 21, an exterior of the flat part 32 and the first heat radiating fin 41 is thermally connected to the container 10. The first heat radiating fin 41 includes a plurality of fins arranged side by side at regular intervals along an extension direction of the flat part 32. The plurality of first heat radiating fins 41 are arranged side by side to form a first heat radiating fin group 42. In the heat sink 1, heights of the plurality of first heat radiating fins 41, 41, 41 . . . , which form the first heat radiating fin group 42, are all substantially the same. In addition, the heights of the first heat radiating fins 41 are equal to or lower than a height of the protruding portion 16. In the heat sink 1, the heights of the first heat radiating fins 41 are set lower than the height of the protruding portion 16 with distal ends of the first heat radiating fins 41 retreated in a direction toward the flat portion 17 of the container 10 with respect to a distal end of the protruding portion 16.

In contrast, no heat radiating fin is provided at the protruding portion 16 of the container 10. In the heat sink 1, no heat radiating fin is provided at either the distal end or the side surface of the protruding portion 16. Therefore, the plurality of first heat radiating fins 41, 41, 41 . . . are arranged from one end to another end of the first surface 21 except the protruding part 31 of the first surface 21.

As illustrated in FIG. 1, the protruding portion 16 of the container 10, which is a part to which a heating element 100, which is an object to be cooled, is to be thermally connected, functions as a heat receiver of the vapor chamber 14, or heat receiver of the heat sink 1. The heating element 100 is thermally connected to the distal end of the protruding portion 16. Therefore, the protruding portion 16 includes the heat receiver to which the heating element 100 is to be thermally connected and the distal end of the protruding portion 16, to which the heating element 100 is to be thermally connected, is provided with no heat radiating fin. Examples of the heating element 100 include an electronic component such as a central processing unit mounted on a wiring board (not illustrated). By virtue of the distal ends of the first heat radiating fins 41 being located in a direction toward the flat portion 17 of the container 10 with respect to the distal end of the protruding portion 16, the heating element 100 can be thermally connected to the distal end of the protruding portion 16 without interference with the first heat radiating fins 41 even though the heating element 100 is mounted on the wiring board.

The second surface 22 is provided with no protruding part, being in the form of a flat surface as a whole. A second heat radiating fin 43 is erected on an exterior of the second surface 22 and the second heat radiating fin 43 is thermally connected to the container 10. The second heat radiating fin 43 is erected on the exterior of the second surface 22 such that a principal surface of the second heat radiating fin 43 is substantially parallel with a principal surface of the first heat radiating fins 41. In addition, the second heat radiating fin 43 includes a plurality of fins arranged side by side at regular intervals along an extension direction of the second surface 22. The plurality of second heat radiating fins 43 are arranged side by side to form a second heat radiating fin group 44. In the heat sink 1, heights of the plurality of second heat radiating fins 43, 43, 43 . . . , which form the second heat radiating fin group 44, are all substantially the same. The plurality of second heat radiating fins 43, 43, 43 . . . are arranged from one end to another end of the second surface 22.

Therefore, the container 10 has a part corresponding to the protruding portion 16, at which the heat radiating fins are thermally connected to only the second surface 22, i.e., only one surface of the plate-shaped container 10. In addition, the container 10 has a part corresponding to the flat portion 17, at which the heat radiating fins are thermally connected to the first surface 21 and the second surface 22, i.e., both surfaces of the plate-shaped container 10. Therefore, the heat radiating fins are thermally connected to the container 10 as being divided between both surfaces (i.e., the first surface 21 and the second surface 22) of the container 10 at the flat portion 17 of the container 10. Thus, the flat portion 17 of the container 10 has an increased fin area of the heat radiating fins as compared with the protruding portion 16. A part of the container 10 to which the first heat radiating fins 41 and the second heat radiating fins 43 are thermally connected functions as a heat radiator of the vapor chamber 14, i.e., a heat radiator of the heat sink 1.

Although a relationship between the heights of the first heat radiating fins 41 and the heights of the second heat radiating fins 43 can be selected as desired in accordance with an environment of installation of the heat sink 1, the amount of heat generation of the heating element 100, etc., the heights of the second heat radiating fins 43 are higher than the heights of the first heat radiating fins 41 in the heat sink 1. Thus, in the heat sink 1, a height of the second heat radiating fin group 44 is higher than a height of the first heat radiating fin group 42.

A wick structure (not illustrated) that generates a capillary force is provided in the cavity 13 of the container 10. The wick structure is provided, for example, across the container 10. The capillary force of the wick structure causes the working fluid, which has undergone a phase change from gas phase to liquid phase through the heat radiator of the vapor chamber 14, to circulate from the heat radiator to the heat receiver of the vapor chamber 14. Examples of the wick structure can include, without limitation, a sintered compact of metal powder such as copper powder, a metal mesh of a metallic wire, unwoven cloth, and a groove (a plurality of narrow grooves) formed in an interior of the container 10 and a combination thereof. In addition, a heat receiving part of the protruding portion 16, to which the heating element 100 is to be connected, that is, a bottom of the protruding portion 16, is provided with, as the wick structure, a first wick structure having a large capillary force, which makes it possible to prevent dry-out. In contrast, a part of the protruding portion 16 other than the bottom, for example, the side surface of the protruding portion 16 of the container 10 and the flat portion 17 of the container 10 or the side surface of the container 10, is provided with, as the wick structure, a second wick structure having a smaller capillary force than the first wick structure, which makes it possible to reduce a flow path resistance during circulation of the working fluid in the liquid phase. In a case where the wick structure is, for example, a sintered compact of metal powder, an average primary particle diameter of a material of the first wick structure, or metal powder, may be in a range from 50 μm to 100 μm and an average primary particle diameter of a material of the second wick structure, or metal powder, is in a range from 200 μm to 300 μm.

The steam flow path 15, which is an inner space of the container 10, extends across the container 10. Thus, the working fluid in the gas phase can flow across the container 10 by virtue of the steam flow path 15. In addition, a pillar (a columnar member) for maintaining the inner space of the container 10 can be provided in the steam flow path 15. In order to reduce the flow path resistance during circulation of the working fluid in the liquid phase, examples of the pillar can include, without limitation, a composite pillar including a columnar metal member (for example, a copper member) circumferentially covered with a wick structure and a columnar sintered compact of metal powder such as copper powder.

Examples of a material of the container 10 can include stainless steel, copper, copper alloy, aluminum, aluminum alloy, tin, tin alloy, titanium, titanium alloy, nickel, and nickel alloy. Examples of materials of the first heat radiating fins 41 and the second heat radiating fin 43 include, without limitation, metal materials such as copper, copper alloy, aluminum, and aluminum alloy, carbon materials such as graphite, and composite members including a carbon material.

The working fluid encapsulated in the cavity 13 can be selected as desired in accordance with compatibility with the material of the container 10. Examples of the working fluid can include water, fluorocarbons, cyclopentane, ethylene glycol, and mixtures thereof.

In addition, the heat sink 1 may be forcedly air-cooled using a blast fan (not illustrated), if necessary. A cooling air from the blast fan is supplied along the principal surfaces of the first heat radiating fins 41 and the second heat radiating fins 43, whereby the first heat radiating fin group 42 and the second heat radiating fin group 44 are cooled.

Thereafter, description will be made on a mechanism of a cooling function of the heat sink 1. First, the heating element 100, which is an object to be cooled, is thermally connected to the distal end of the protruding portion 16 of the container 10. With the container 10 receiving heat from the heating element 100 at the protruding portion 16, the heat is transferred, at the protruding portion 16 of the container 10, from the heating element 100 to the working fluid in the liquid phase in the cavity 13, causing a phase change from the working fluid in the liquid phase to the working fluid in the gas phase. The working fluid in the gas phase flows through the steam flow path 15 from the protruding portion 16 to the flat portion 17 of the container 10, being diffused all over the flat portion 17. As the working fluid in the gas phase is diffused all over the flat portion 17 from the protruding portion 16 of the container 10, the container 10 transports the heat from the heating element 100 all over the container 10 from the protruding portion 16 with the heat from the heating element 100 diffused all over the container 10. The working fluid in the gas phase, which can flow all over the container 10, radiates latent heat by virtue of a heat exchange effect of the first heat radiating fin group 42 and the second heat radiating fin group 44, undergoing a phase change from the gas phase to the liquid phase. The radiated latent heat is transferred to the first heat radiating fin group 42 and the second heat radiating fin group 44 thermally connected to the container 10. The heat transferred from the container 10 to the first heat radiating fin group 42 and the second heat radiating fin group 44 is discharged to an external environment of the heat sink 1 through the first heat radiating fin group 42 and the second heat radiating fin group 44. The capillary force of the wick structure provided in the container 10 causes the working fluid, which has radiated the latent heat to undergone the phase change from the gas phase to the liquid phase, to circulate from the flat portion 17 to the protruding portion 16 of the container 10, that is, circulate from the heat radiator to the heat receiver of the vapor chamber 14.

In the heat sink 1 according to the first embodiment of the present disclosure, the first surface 21 of the container 10 has the flat part 32 and the protruding part 31 projecting from the flat part 32 in the external direction, causing the container 10 to have the flat portion 17 and the protruding portion 16 projecting from the flat portion 17 in the external direction, and the first heat radiating fins 41 are provided on the exterior of the flat portion 17 of the first surface 21, while the second heat radiating fins 43 are provided on the second surface 22 in the form of a flat surface as a whole, which makes it possible to prevent a heat radiation efficiency of the first heat radiating fins 41 and the second heat radiating fin 43 from being decreased and increase the fin area of the heat radiating fins and, as a result, to exhibit an excellent cooling performance. In other words, in the heat sink 1, the heat radiating fins are thermally connected to the container 10 as being divided into the first heat radiating fins 41 and the second heat radiating fin 43 with the container 10 in between, which makes it possible to prevent creation of a region not sufficiently contributable to heat radiation and, consequently, prevent a decrease in heat radiation efficiency of the heat radiating fins even though the fin area of the heat radiating fins is increased.

In addition, in the heat sink 1 according to the first embodiment of the present disclosure, the inner surface of the protruding portion 16 of the container 10 is in communication with the inner surface of the flat portion 17, causing the cavity 13 of the container 10 to be formed, which makes it possible to prevent a thermal resistance between the flat portion 17 of the container 10, which functions as a heat radiator, and the protruding portion 16 of the container 10, which functions as a heat receiver, and to efficiently cool even the heating element 100 having a large amount of heat generation.

In addition, in the heat sink 1 according to the first embodiment of the present disclosure, the heights of the second heat radiating fins 43 are higher than the heights of the first heat radiating fins 41, which makes it possible to increase the fin area of the heat radiating fins and exhibit an excellent heat radiation performance in a case where a space is formed on a second surface 22 side where the second heat radiating fins 43 are provided.

Figure 2:
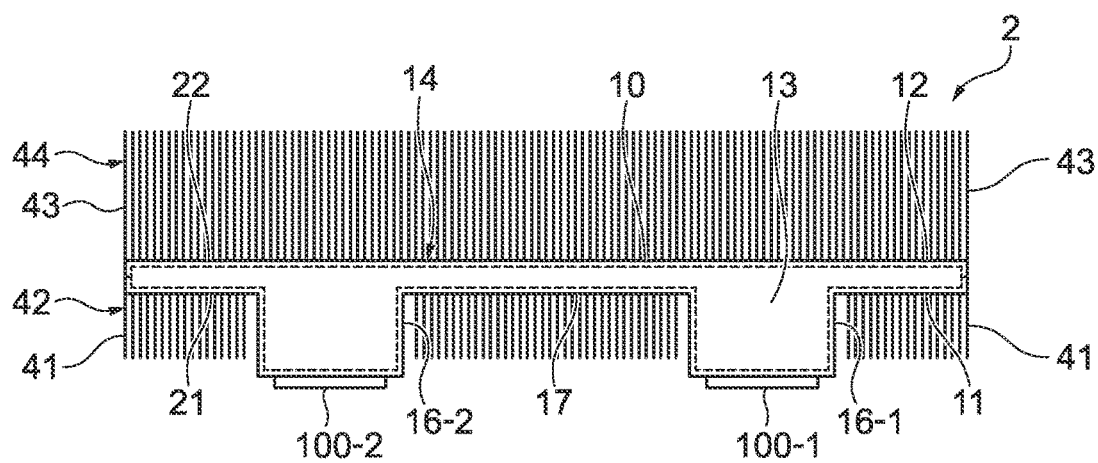
FIG. 2 is a side view of assistance in explaining the summary of a heat sink according to a second embodiment of the present disclosure.

Thereafter, a detailed description will be made on a heat sink according to a second embodiment of the present disclosure. FIG. 2 is a side view of assistance in explaining the summary of the heat sink according to the second embodiment of the present disclosure. It should be noted that the main components are common to the heat sink according to the second embodiment and the heat sink according to the first embodiment and, accordingly, the same components will be described with use of the same reference numerals as those of the heat sink according to the first embodiment.

While the container 10 has the single protruding portion 16 provided at the middle portion of the first surface 21 in the heat sink 1 according to the first embodiment, instead of that, a heat sink 2 according to the second embodiment has, a plurality of protruding portions 16 provided on the first surface 21 of the container 10 in accordance with existence of a plurality of heating elements 100, which are objects to be cooled, as illustrated in FIG. 2. In the heat sink 2, in accordance with existence of two heating elements 100-1, 100-2 as objects to be cooled, two protruding portions 16-1, 16-2, which are to be thermally connected respectively to the heating elements 100-1, 100-2, are provided.

The positions of the plurality of protruding portions 16 can be selected as desired in accordance with conditions of use of the heat sink 2, the locations of the plurality of heating elements 100, etc. In FIG. 2, the protruding portions 16 are provided one by one at both end portions of the container 10 for the convenience of explanation. In additions, in the heat sink 2, the two protruding portions 16-1, 16-2 are both provided at a middle portion in a width direction of the container 10, although the illustration is omitted. In addition, in the heat sink 2, a height of the protruding portion 16-1 is the same as a height of the protruding portion 16-2 in accordance with the fact that the heights of the heating elements 100-1, 100-2 are the same.

In the heat sink 2 where the container 10 has the plurality of protruding portions 16 in accordance with existence of the plurality of heating elements 100, the heat radiating fins are likewise thermally connected to the container 10 as being divided into the first heat radiating fins 41 and the second heat radiating fins 43 with the container 10 in between, which makes it possible to prevent a decrease in heat radiation efficiency of the first heat radiating fins 41 and the second heat radiating fins 43 and increase the fin area of the heat radiating fins and, as a result, to exhibit an excellent heat radiation performance.

Figure 3:
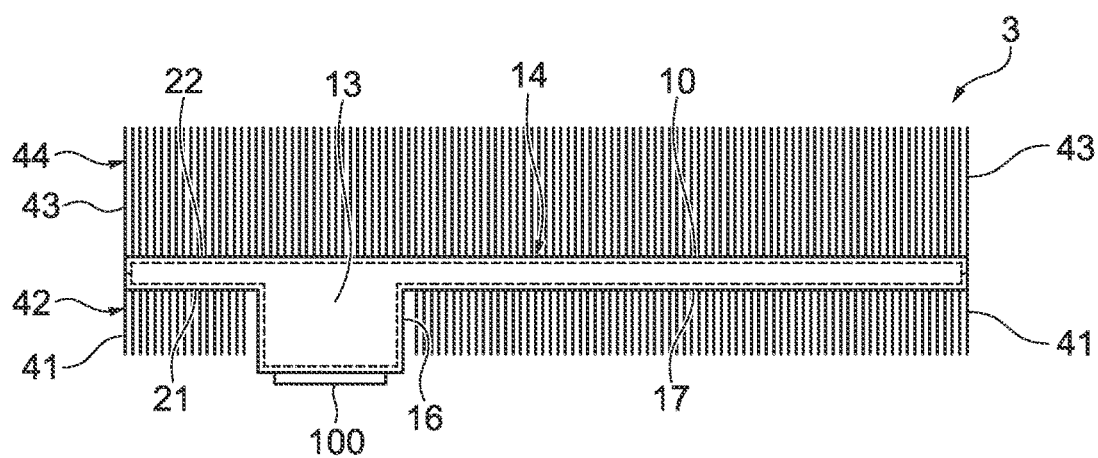
FIG. 3 is a side view of assistance in explaining the summary of a heat sink according to a third embodiment of the present disclosure.

Thereafter, a detailed description will be made on a heat sink according to a third embodiment of the present disclosure. FIG. 3 is a side view of assistance in explaining the summary of the heat sink according to the third embodiment of the present disclosure. It should be noted that the main components are common to the heat sink according to the third embodiment and the heat sinks according to the first and second embodiments and, accordingly, the same components will be described with use of the same reference numerals as those of the heat sinks according to the first and second embodiments.

While the single protruding portion 16 is provided at the middle portion of the first surface 21 of the container 10 in the heat sink 1 according to the first embodiment, instead of that, the single protruding portion 16 is provided at an end portion of the first surface 21 of the container 10 in a heat sink 3 according to the third embodiment as illustrated in FIG. 3. As described above, it is possible to select the position of the protruding portion 16 in the container 10 as desired in accordance with an environment where the heat sink 3 is to be installed, the location of the heating element 100, etc.

In the heat sink 3 where the protruding portion 16 is provided at the end portion of the container 10 in accordance with the location of the heating element 100, etc., the heat radiating fins are likewise thermally connected to the container 10 as being divided into the first heat radiating fins 41 and the second heat radiating fins 43 with the container 10 in between, which makes it possible to prevent a decrease in heat radiation efficiency of the first heat radiating fins 41 and the second heat radiating fins 43 and increase the fin area of the heat radiating fins and, as a result, to exhibit an excellent heat radiation performance.

Figure 4:
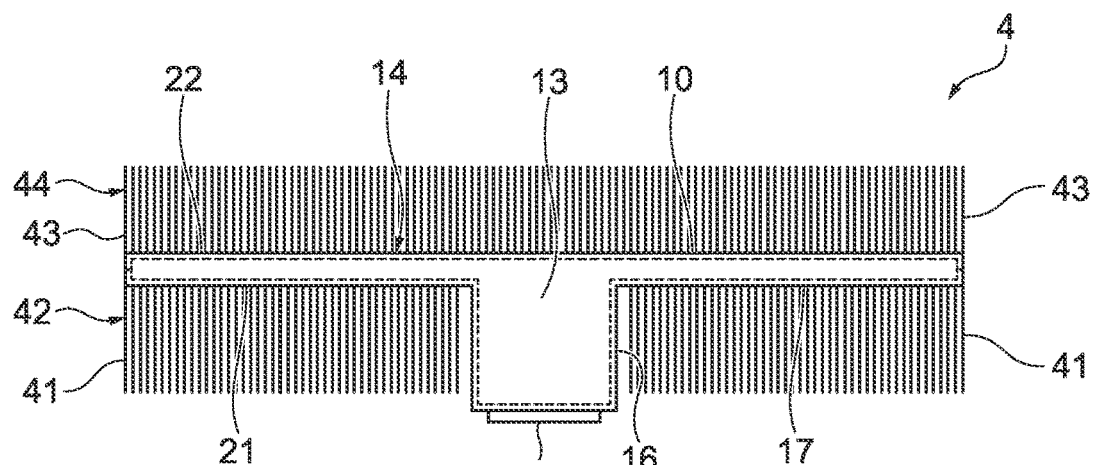
FIG. 4 is a side view of assistance in explaining the summary of a heat sink according to a fourth embodiment of the present disclosure.

Thereafter, a detailed description will be made on a heat sink according to a fourth embodiment of the present disclosure. FIG. 4 is a side view of assistance in explaining the summary of the heat sink according to the fourth embodiment of the present disclosure. It should be noted that the main components are common to the heat sink according to the fourth embodiment and the heat sinks according to the first to third embodiments and, accordingly, the same components will be described with use of the same reference numerals as those of the heat sinks according to the first to third embodiments.

While the heights of the second radiating fins 43 are higher than the heights of the first heat radiating fins 41 in the heat sinks 1, 2, 3 according to the first to third embodiments, instead of that, the heights of the first heat radiating fins 41 are higher than the heights of the second heat radiating fins 43 in a heat sink 4 according to the fourth embodiment as illustrated in FIG. 4. Thus, in the heat sink 4, the height of the first heat radiating fin group 42 is higher than the height of the second heat radiating fin group 44. In the heat sink 4, since the height of the protruding portion 16 is higher than the heights of the protruding portions 16 of the heat sinks 1, 2, 3 according to the first to third embodiments, the heights of the first heat radiating fins 41 are higher than the heights of the second heat radiating fins 43.

In the heat sink 4, in a case where a relatively large space is formed on a first surface 21 side where the first heat radiating fins 41 are provided, that is, a side where the heating element 100 is located, the fin area of the heat radiating fins can be increased with an efficient use of the space on the first surface 21 side. As described above, it is possible to select the heights of the first heat radiating fins 41 and the heights of the second heat radiating fins 43 as desired in accordance with the layout of surroundings, a direction of supply of the cooling air, etc.

In addition, the heights of the first heat radiating fins 41 may be the same as the heights of the second heat radiating fins 43 and thus the first heat radiating fins 41 may have heights equal to or higher than the heights of the second heat radiating fins 43.

In the heat sink 4 where the first heat radiating fins 41 have heights equal to or higher than the heights of the second heat radiating fins 43, the heat radiating fins are likewise thermally connected to the container 10 as being divided into the first heat radiating fins 41 and the second heat radiating fins 43 with the container 10 in between, which makes it possible to prevent a decrease in heat radiation efficiency of the first heat radiating fins 41 and the second heat radiating fins 43 and increase the fin area of the heat radiating fins and, as a result, to exhibit an excellent heat radiation performance.

Figure 5:
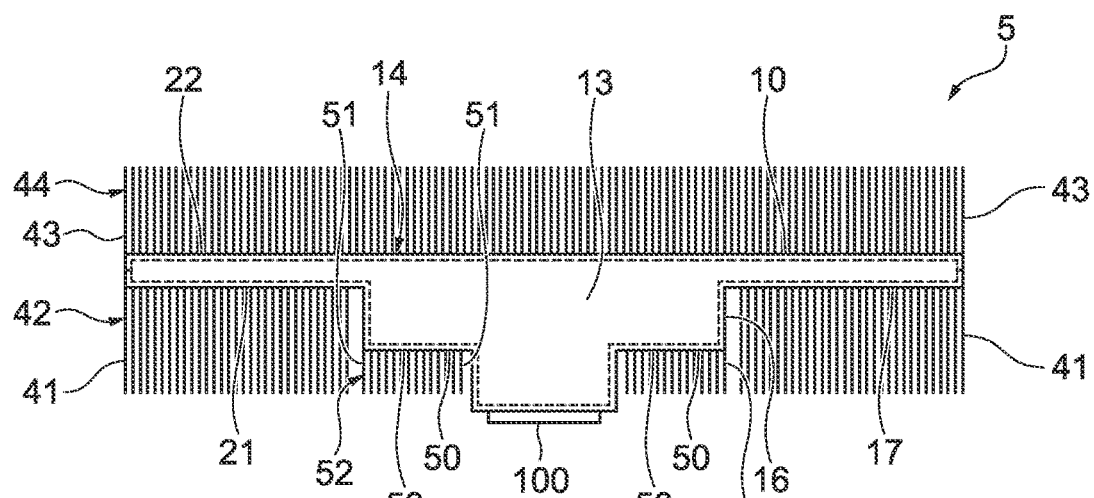
FIG. 5 is a side view of assistance in explaining the summary of a heat sink according to a fifth embodiment of the present disclosure.

Thereafter, a detailed description will be made on a heat sink according to a fifth embodiment of the present disclosure. FIG. 5 is a side view of assistance in explaining the summary of the heat sink according to the fifth embodiment of the present disclosure. It should be noted that the main components are common to the heat sink according to the fifth embodiment and the heat sinks according to the first to fourth embodiments and, accordingly, the same components will be described with use of the same reference numerals as those of the heat sinks according to the first to fourth embodiments.

In a heat sink 5 according to the fifth embodiment, the protruding portion 16 has a stepped portion 50 and a third heat radiating fin 51 is additionally erected on an exterior 53 of the stepped portion 50 as illustrated in FIG. 5. The third heat radiating fin 51 is erected on the exterior 53 of the stepped portion 50, which is opposed to the heating element 100, such that a principal surface of the third heat radiating fin 51 is substantially parallel with the principal surface of the first heat radiating fins 41. The third heat radiating fin 51 includes a plurality of third heat radiating fins 51, 51, 51 . . . arranged side by side along the exterior 53 of the stepped portion 50 to form a third heat radiating fin group 52. Heights of the plurality of third heat radiating fins 51, 51, 51 . . . are all substantially the same.

Distal ends of the third heat radiating fins 51 are retreated in the direction toward the flat portion 17 of the container 10 with respect to the distal end of the protruding portion 16. In addition, the distal ends of the third heat radiating fins 51 are located substantially in the same plane as the distal ends of the first heat radiating fins 41.

In the heat sink 5, the stepped portion 50 of the protruding portion 16, on which the third heat radiating fins 51 are erected, functions as a heat radiator. Thus, the protruding portion 16 includes a heat receiver having a distal end to which the heating element 100 is to be thermally connected and the heat radiator to which the third heat radiating fins 51 are thermally connected.

In the heat sink 5, the protruding portion 16 has the stepped portion 50 and the third heat radiating fins 51 are additionally provided on the exterior 53 of the stepped portion 50, which makes it possible to further increase the number of the heat radiating fins connected to the container 10 while the protruding portion 16 is provided. The heat radiation performance is thus further improved. In addition, in the heat sink 5, heat from the heating element 100 can be diffused in a plane direction of the container 10 in advance at the protruding portion 16 having the stepped portion 50, which makes it possible to reduce a thermal load on the vapor chamber 14.

In the heat sink 5 where the protruding portion 16 has the stepped portion 50 and the third heat radiating fins 51 are provided on the exterior 53 of the stepped portion 50, the heat radiating fins are likewise thermally connected to the container 10 as being divided into the first heat radiating fins 41 and the second heat radiating fins 43 with the container 10 in between, which makes it possible to prevent a decrease in heat radiation efficiency of the first heat radiating fins 41 and the second heat radiating fins 43 and increase the fin area of the heat radiating fins and, as a result, to exhibit an excellent heat radiation performance.

Figure 6:
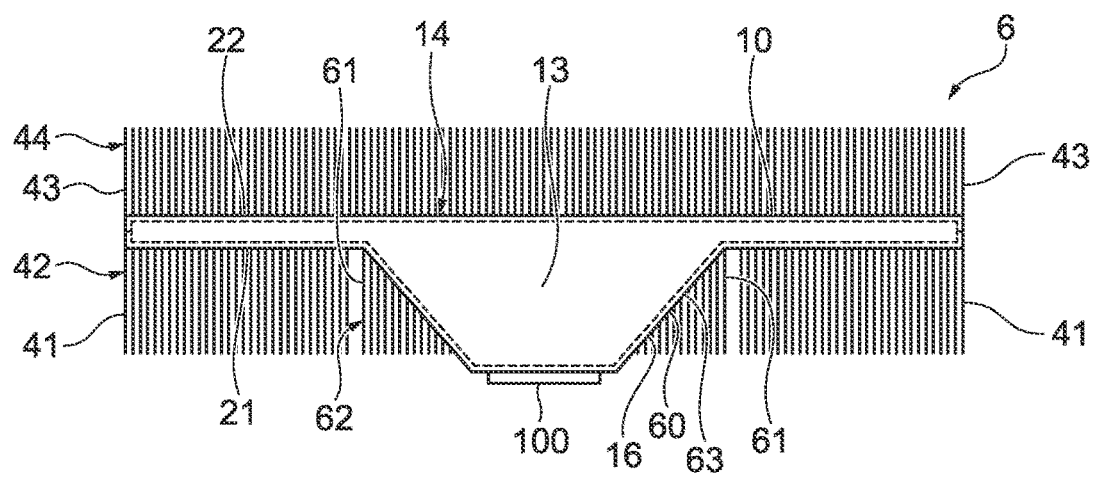
FIG. 6 is a side view of assistance in explaining the summary of a heat sink according to a sixth embodiment of the present disclosure.

Thereafter, a detailed description will be made on a heat sink according to a sixth embodiment of the present disclosure. FIG. 6 is a side view of assistance in explaining the summary of the heat sink according to the sixth embodiment of the present disclosure. It should be noted that the main components are common to the heat sink according to the sixth embodiment and the heat sinks according to the first to fifth embodiments and, accordingly, the same components will be described with use of the same reference numerals as those of the heat sinks according to the first to fifth embodiments.

While the side surface of the protruding portion 16 projects from the flat portion 17 in the vertical direction in the heat sinks 1, 2, 3 according to the first to third embodiments, instead of that, the side surface of the protruding portion 16 of a heat sink 6 according to the sixth embodiment projects from the flat portion 17 in an oblique direction and the side surface of the protruding portion 16 is in the form of a slanted portion 60 further narrowed as progress toward the distal end of the protruding portion 16 as illustrated in FIG. 6. In addition, a fourth heat radiating fin 61 is additionally erected on an exterior 63 of the slanted portion 60 forming the side surface of the protruding portion 16. The fourth heat radiating fin 61 is erected on the exterior 63 of the slanted portion 60 such that a principal surface of the fourth heat radiating fin 61 is substantially parallel with the principal surface of the first heat radiating fins 41.

The fourth heat radiating fin 61 includes a plurality of heat radiating fins 61, 61, 61 . . . arranged side by side along the exterior 63 of the slanted portion 60 to form a fourth heat radiating fin group 62. Distal ends of the fourth heat radiating fins 61 are retreated in the direction toward the flat portion 17 of the container 10 with respect to the distal end of the protruding portion 16. In addition, the distal ends of the fourth heat radiating fins 61 are located substantially in the same plane as the distal ends of the first heat radiating fins 41. Thus, the fourth heat radiating fins 61 have different heights depending on positions at which the fourth heat radiating fins 61 are thermally connected in the slanted portion 60.

In the heat sink 6, the slanted portion 60 of the protruding portion 16, on which the fourth heat radiating fins 61 are erected, functions as a heat radiator. Thus, the protruding portion 16 includes a heat receiver having a distal end to which the heating element 100 is to be thermally connected and the heat radiator to which the fourth heat radiating fins 61 are thermally connected.

In the heat sink 6, the side surface of the protruding portion 16 has the slanted portion 60, which is further narrowed as progress toward the distal end of the protruding portion 16, with the fourth heat radiating fins 61 additionally provided on the exterior 63 of the slanted portion 60, which makes it possible to further increase the number of the heat radiating fins connected to the container 10 while the protruding portion 16 is provided. The heat radiation performance is thus further improved. In addition, in the heat sink 6, heat from the heating element 100 can be diffused in a plane direction of the container 10 in advance at the protruding portion 16 having the slanted portion 60, which makes it possible to reduce a thermal load on the vapor chamber 14.

In the heat sink 6 where the protruding portion 16 has the slanted portion 60 and the fourth heat radiating fin 61 is provided on the exterior 63 of the slanted portion 60, the heat radiating fins are likewise thermally connected to the container 10 as being divided into the first heat radiating fins 41 and the second heat radiating fins 43 with the container 10 in between, which makes it possible to prevent a decrease in heat radiation efficiency of the first heat radiating fins 41 and the second heat radiating fins 43 and increase the fin area of the heat radiating fins and, as a result, to exhibit an excellent heat radiation performance.

Figure 7:
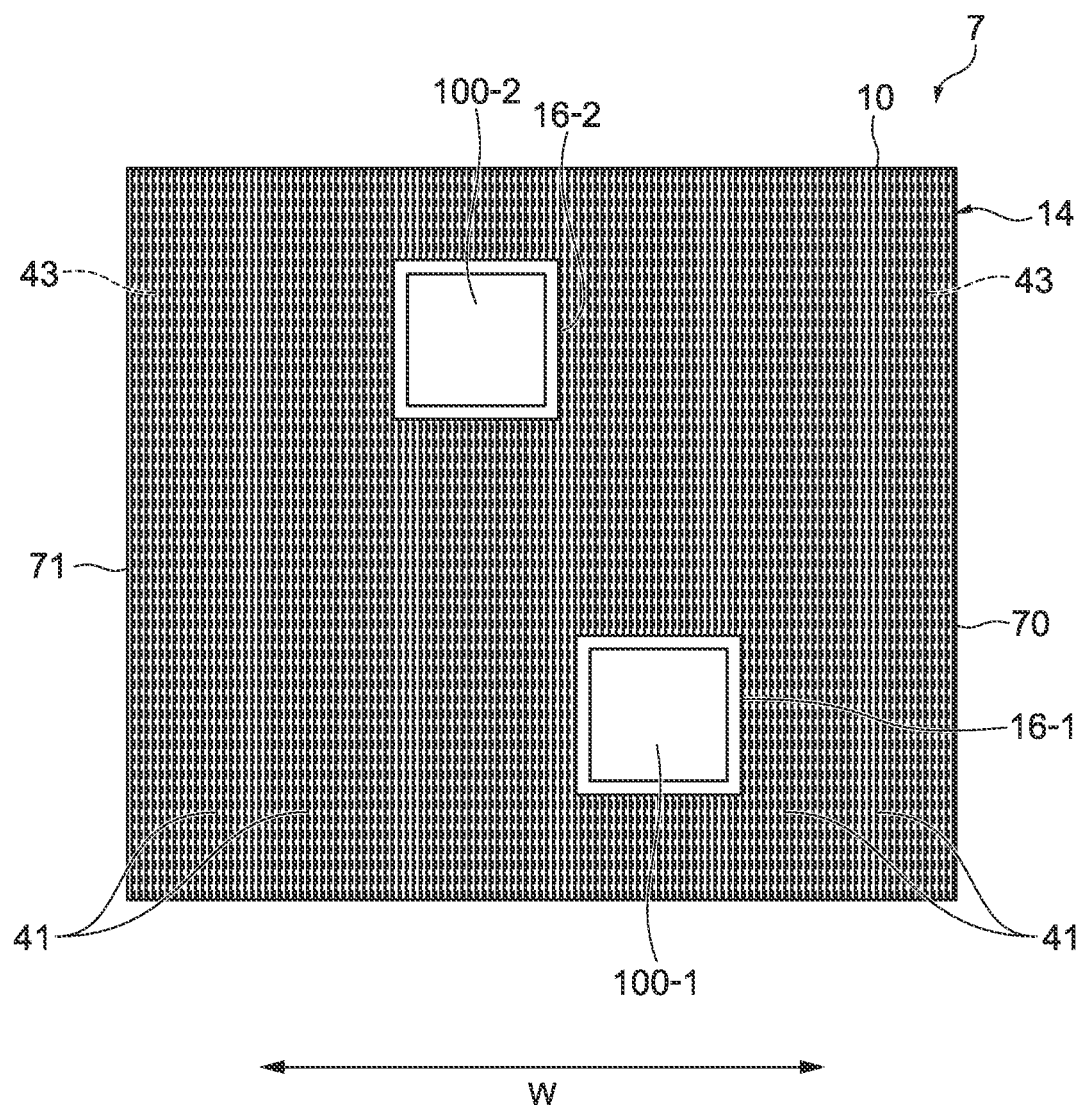
FIG. 7 is a bottom view of assistance in explaining the summary of a heat sink according to a seventh embodiment of the present disclosure.

Thereafter, a detailed description will be made on a heat sink according to a seventh embodiment of the present disclosure. FIG. 7 is a bottom view of assistance in explaining the summary of the heat sink according to the seventh embodiment of the present disclosure. It should be noted that the main components are common to the heat sink according to the seventh embodiment and the heat sinks according to the first to sixth embodiments and, accordingly, the same components will be described with use of the same reference numerals as those of the heat sinks according to the first to sixth embodiments.

While the two protruding portions 16-1, 16-2 are both provided at the middle portion in the width direction of the container 10 in the heat sink 2 according to the second embodiment, instead of that, the protruding portion 16-1 and the protruding portion 16-2 are provided respectively at one end 70 in a width direction W of the container 10 and another end 71 in the width direction W of the container 10 in a heat sink 7 according to the seventh embodiment as illustrated in FIG. 7.

In the heat sink 7, the two protruding portions 16-1, 16-2 are provided at the different positions relative to the width direction W of the container 10, which makes it possible to supply a sufficient cooling air to the protruding portion 16-1, which is thermally connected to the heating element 100-1, and the protruding portion 16-2, which is thermally connected to the heating element 100-2, even in a case where the cooling air is supplied in an orthogonal direction relative to the width direction W of the container 10. In addition, in the heat sink 7, the heat radiating fins are likewise thermally connected to the container 10 as being divided into the first heat radiating fins 41 and the second heat radiating fins 43 with the container 10 in between, which makes it possible to prevent a decrease in heat radiation efficiency of the first heat radiating fins 41 and the second heat radiating fins 43 and increase the fin area of the heat radiating fins and, as a result, to exhibit an excellent heat radiation performance.

Figure 8:
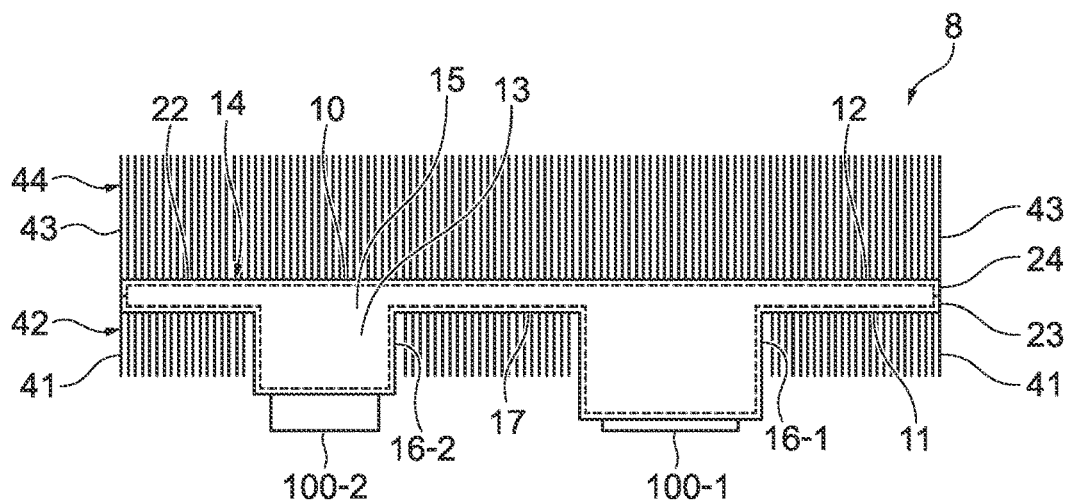
FIG. 8 is a side view of assistance in explaining the summary of a heat sink according to an eighth embodiment of the present disclosure.

Thereafter, a detailed description will be made on a heat sink according to an eighth embodiment of the present disclosure. FIG. 8 is a side view of assistance in explaining the summary of the heat sink according to the eighth embodiment of the present disclosure. It should be noted that the main components are common to the heat sink according to the eighth embodiment and the heat sinks according to the first to seventh embodiments and, accordingly, the same components will be described with use of the same reference numerals as those of the heat sinks according to the first to seventh embodiment.

While the heights of the plurality of protruding portions 16, that is, the height of the protruding portion 16-1 and the height of the protruding portion 16-2, are the same in the heat sink 2 according to the second embodiment, instead of that, the heights of the protruding portions 16 are different in a heat sink 8 according to the eighth embodiment as illustrated in FIG. 8. In the heat sink 8, the height of the protruding portion 16-1 is higher than the height of the protruding portion 16-2 in accordance with the fact that a height of the heating element 100-1 is lower than a height of the heating element 100-2. As described above, the heights of the plurality of protruding portions 16 can be selected as desired in accordance with the heights of the plurality of heating elements 100 to which the heat sink 8 is to be thermally connected.

Even though the heights of the plurality of heating elements 100 are different, the heat sink 8 is excellent in thermal connection to the individual heating elements 100. In addition, in the heat sink 8, the heat radiating fins are likewise thermally connected to the container 10 as being divided into the first heat radiating fins 41 and the second heat radiating fins 43 with the container 10 in between, which makes it possible to prevent a decrease in heat radiation efficiency of the first heat radiating fins 41 and the second heat radiating fins 43 and increase the fin area of the heat radiating fins and, as a result, to exhibit an excellent heat radiation performance.

Figure 9:
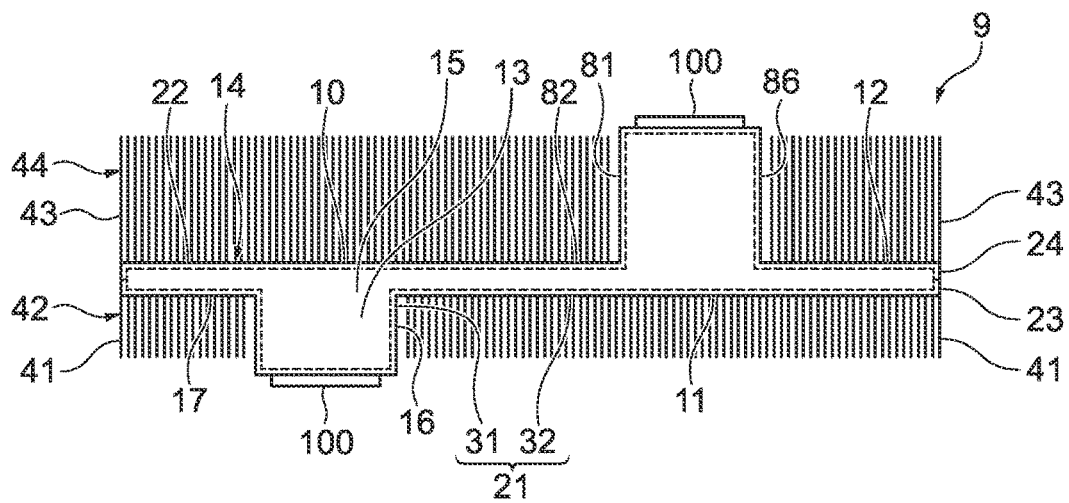
FIG. 9 is a side view of assistance in explaining the summary of a heat sink according to a ninth embodiment of the present disclosure.

Thereafter, a detailed description will be made on a heat sink according to a ninth embodiment of the present disclosure. FIG. 9 is a side view of assistance in explaining the summary of the heat sink according to the ninth embodiment of the present disclosure. It should be noted that the main components are common to the heat sink according to the ninth embodiment and the heat sinks according to the first to eighth embodiments and, accordingly, the same components will be described with use of the same reference numerals as those of the heat sinks according to the first to eighth embodiments.

In the heat sink 1 according to the first embodiment, the second surface 22 has no protruding part and the second surface 22 is in the form of a flattened flat part as a whole, whereas the first surface 21 has the flat part 32 and the protruding part 31 projecting from the flat part 32 in the external direction, which causes the container 10 to have the flat portion 17 and the protruding portion 16 projecting from the flat portion 17 in the external direction. Instead of that, in a heat sink 9 according to the ninth embodiment, the first surface 21 has the flat part 32 and the protruding part 31 projecting from the flat part 32 in the external direction, whereas the second surface 22 has a flat part 82 and a protruding part 81 projecting from the flat part 82 in the external direction, which causes the container 10 to have the flat portion 17 and protruding portions 16, 86 projecting from the flat portion 17 in the external direction as illustrated in FIG. 9.

Thus, the container 10 has the protruding portion 16 provided on the first surface 21 and the protruding portion 86 provided on the second surface 22. It should be noted that in the heat sink 9, the single protruding portion 16 is provided at one end of the first surface 21 and the single protruding portion 86 is provided at the other end of the second surface 22 for the convenience of explanation.

In the heat sink 9, no heat radiating fin is likewise provided at the protruding portion 16 provided on the first surface 21 like the heat sink 1 according to the first embodiment. In the heat sink 9, no heat radiating fin is likewise provided at either the distal end or the side surface of the protruding portion 16. Therefore, the plurality of first heat radiating fins 41, 41, 41 . . . are arranged from the one end to the other end of the first surface 21 except the protruding part 31 of the first surface 21. In contrast, in the heat sink 9, the protruding portion 86 is provided on the second surface 22 and no heat radiating fin is provided at the protruding portion 86. In the heat sink 9, no heat radiating fin is likewise provided at either the distal end or the side surface of the protruding portion 86. Therefore, the plurality of second heat radiating fins 43, 43, 43 . . . are arranged from one end to the other end of the second surface 22 except the protruding part 81 of the second surface 22.

Therefore, at a part of the container 10 corresponding to the protruding portion 16, the heat radiating fins are thermally connected to only the second surface 22, that is, only one surface of the plate-shaped container 10. In addition, at a part corresponding to the protruding portion 86, the heat radiating fins are thermally connected to only the first surface 21, that is, only one surface of the plate-shaped container 10. In addition, at a part of the container 10 other than the protruding portions 16, 86, or part corresponding to the flat portion 17, the heat radiating fins are thermally connected to the first surface 21 and the second surface 22, that is, both surfaces of the plate-shaped container 10.

As described above, in addition to the protruding portion 16 being provided on the first surface 21 of the container 10, the protruding portion 86 may be additionally provided also on the second surface 22 in accordance with an environment where the heat sink 9 is to be installed, the location of the heating element 100, etc. In the heat sink 9, the heat radiating fins are likewise thermally connected to the container 10 as being divided into the first heat radiating fins 41 and the second heat radiating fins 43 with the container 10 in between, which makes it possible to prevent a decrease in heat radiation efficiency of the first heat radiating fins 41 and the second heat radiating fins 43 and increase the fin area of the heat radiating fins and, as a result, to exhibit an excellent heat radiation performance.

Figure 10:
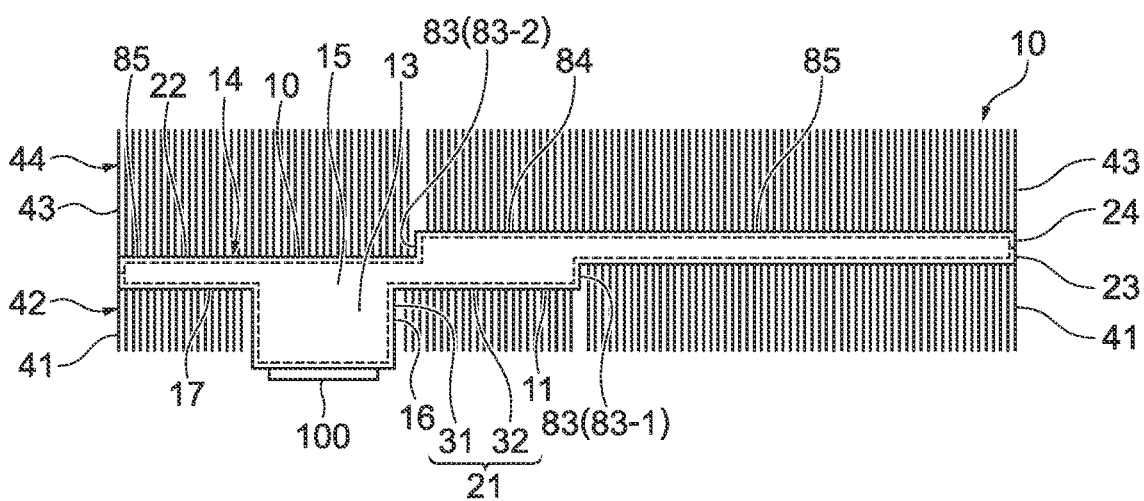
FIG. 10 is a side view of assistance in explaining the summary of a heat sink according to a tenth embodiment of the present disclosure.

Thereafter, a detailed description will be made on a heat sink according to a tenth embodiment of the present disclosure. FIG. 10 is a side view of assistance in explaining the summary of the heat sink according to the tenth embodiment of the present disclosure. It should be noted that the main components are common to the heat sink according to the tenth embodiment and the heat sinks according to the first to ninth embodiments and, accordingly, the same components will be described with use of the same reference numerals as those of the heat sinks according to the first to ninth embodiments.

In a heat sink 10 according to the tenth embodiment, the flat portion 17 of the container 10 is provided with a step 83 in a thickness direction of the container 10 as illustrated in FIG. 10. In the heat sink 10, the flat portion 17 of the container 10 is thus a terraced flat portion where flat surfaces are formed in a terraced manner. The flat portion 17 of the container 10 is provided with the step 83, thus having a first part 84 where the cavity 13 is relatively thick and a second part 85 where the cavity 13 is relatively thin. In the heat sink 10, a step 83-1 is formed on the flat part 32 of the first surface 21 and a step 83-2 is formed on the second surface 22 where no protruding part is provided. The flat portion 17 of the container 10 has the first part 84 between the step 83-1 and the step 83-2.

In addition, the first heat radiating fins 41 are provided at the first part 84 and the second part 85 and the second heat radiating fins 43 are provided at the first part 84 and the second part 85.

In the heat sink 10 where the first part 84, at which the cavity 13 is relatively thick, and the second part 85, at which the cavity 13 is relatively thin, are formed in the flat portion 17 of the container 10 to which the heat radiating fins are thermally connected, the heat radiating fins are likewise thermally connected to the container 10 as being divided into the first heat radiating fins 41 and the second heat radiating fins 43 with the container 10 in between, which makes it possible to prevent a decrease in heat radiation efficiency of the first heat radiating fins 41 and the second heat radiating fins 43 and increase the fin area of the heat radiating fins and, as a result, to exhibit an excellent heat radiation performance.

Thereafter, description will be made on other embodiments of the present disclosure. In the heat sinks of the above-described embodiments, the first heat radiating fins are arranged from one end to the other end of the first surface except the protruding part and the second heat radiating fins are arranged from one end to the other end of the second surface. However, instead of that, the first heat radiating fins may be provided only at a partial region of the first surface except the protruding part and the second heat radiating fins may be provided only at a partial region of the second surface. In addition, in the heat sinks of the above-described embodiments, the first heat radiating fins and the second heat radiating fins are erected such that the principal surface of the first heat radiating fins and the principal surface of the second heat radiating fins are substantially parallel. However, the first heat radiating fins and the second heat radiating fins may be erected such that the principal surface of the first heat radiating fins and the principal surface of the second heat radiating fins are not parallel in accordance with conditions of use of the heat sink, etc. The protruding portion is provided at the middle portion in the width direction of the container in the heat sink of the second embodiment and the protruding portion is provided at each of one end and the other end in the width direction of the container in the heat sink according to the seventh embodiments. However, the protruding portion may be provided at each of the middle portion, one end, and the other end in the width direction of the container or may be provided at one end or the other end in the width direction of the container.

In addition, a fin for increasing a surface area inside the container (a container interior area increasing fin) may be provided in a protruding portion within the cavity of the container, if necessary. By virtue of the container interior area increasing fin being provided in the protruding portion, a phase change of the working fluid in the liquid phase to the gas phase is accelerated with a heat transport performance of the vapor chamber further improved.

The heat sink according to the present disclosure is able to exhibit an excellent cooling performance by preventing a decrease in heat radiation efficiency of the heat radiating fins and increasing the fin area of the heat radiating fins and, accordingly, highly useful in the field of cooling of an electronic component having a large amount of heat generation installed in a narrow space, such as an electronic component mounted in a server.

What is claimed is:

1. A heat sink comprising:
   a container having a cavity formed inside and that has a first surface and a second surface opposite the first surface; a working fluid encapsulated in the cavity; and a steam flow path defined in the cavity and through which the working fluid in a gas phase flows, wherein
   the first surface has a flat part and a protruding part projecting from the flat part in an external direction, causing the container to have a flat portion and a protruding portion projecting from the flat portion in the external direction,
   an inner space of the protruding portion of the container is in communication with an inner space of the flat portion, causing the cavity to be formed,
   a first heat radiating fin is provided on an exterior of the flat pail of the first surface and a second heat radiating fin is provided on an exterior of the second surface,
   the first heat radiating fin includes a plurality of fins arranged side by side at regular intervals along an extension direction of the flat part, the plurality of fins is provided on an entirety of the flat part of the first surface,
   the protruding portion is provided at a middle portion, one end, and/or another end in a width direction of the container,
   a bottom part of the protruding portion is provided with a first wick structure having a first capillary force and another part of the container different than the bottom part, of the protruding portion is provided with a second wick structure having a second capillary force, and
   the second capillary force is smaller than the first capillary force.

2. The heat sink according to claim 1, wherein the container includes one plate-shaped body and another plate-shaped body opposite the one plate-shaped body, the one plate-shaped body having the protruding portion projecting in the external direction.

3. The heat sink according to claim 1, wherein the protruding portion includes a heat, receiver to which a heating element is thermally connected and no heat radiating fin is provided at a distal end of the protruding portion, wherein the heating element is an object to be cooled.

4. The heat sink according to claim 1, wherein the protruding portion has a stepped portion and wherein a third heat radiating fin is additionally provided on an exterior of the stepped portion.

5. The heat sink according to claim 1, wherein a side surface of the protruding portion has a slanted portion further narrowed as progress toward a distal end of the protruding portion and wherein a fourth heat radiating fin is additionally provided on an exterior of the slanted portion.

6. The heat sink according to claim 1, wherein the protruding portion comprises a single protruding portion.

7. The heat sink according to claim 1, wherein a plurality of protruding portions including the protruding portion are provided.

8. The heat sink according to claim 1, wherein the flat portion of the container is provided with a step.

9. The heat sink according to claim 1, wherein a wick structure comprising the first wick structure and the second wick structure is provided in the cavity across the container where the inner space of the protruding portion is in communication with the inner space of the flat portion.

10. The heat sink according to claim 1, wherein the other part of the container comprises a side surface of the protruding portion, the flat portion, a side surface of the container, or combinations thereof.

* * * * *